United States Patent
Hotta

(10) Patent No.: US 9,295,173 B2
(45) Date of Patent: Mar. 22, 2016

(54) CASING FOR ELECTRICAL EQUIPMENT

(71) Applicant: Toshiba Schneider Inverter Corporation, Mie-gun, Mie (JP)

(72) Inventor: Yoshihiro Hotta, Mie (JP)

(73) Assignee: Toshiba Schneider Inverter Corporation, Mei-Gun, Mie (JP)

( * ) Notice: Subject to any disclaimer, the term of this patent is extended or adjusted under 35 U.S.C. 154(b) by 0 days.

(21) Appl. No.: 14/691,417

(22) Filed: Apr. 20, 2015

(65) Prior Publication Data

US 2015/0305179 A1    Oct. 22, 2015

(30) Foreign Application Priority Data

Apr. 22, 2014  (JP) ................................. 2014-088224

(51) Int. Cl.
  *H05K 5/02*   (2006.01)
  *H05K 5/00*   (2006.01)
  *H05K 5/03*   (2006.01)

(52) U.S. Cl.
  CPC ............ *H05K 5/0213* (2013.01); *H05K 5/0004* (2013.01); *H05K 5/0217* (2013.01); *H05K 5/03* (2013.01)

(58) Field of Classification Search
  CPC ....... A47B 31/02; H05K 5/03; H05K 5/0004; H05K 5/0213; H05K 5/0217; G06F 1/20
  USPC ................... 312/100, 213, 223.1, 223.2, 236; 454/184; 361/679.46
  See application file for complete search history.

(56) References Cited

U.S. PATENT DOCUMENTS

| | | | | |
|---|---|---|---|---|
| 3,364,838 A | * | 1/1968 | Bradley | 312/213 |
| 4,557,095 A | * | 12/1985 | Rice et al. | 52/473 |
| 5,297,004 A | * | 3/1994 | Mazura | 361/690 |
| 5,372,543 A | * | 12/1994 | Steele | 454/184 |
| 5,697,840 A | * | 12/1997 | Bainbridge et al. | 454/184 |
| 6,289,974 B1 | * | 9/2001 | DeGregoria | F24F 3/1411 165/10 |
| 6,342,004 B1 | * | 1/2002 | Lattimore et al. | 454/184 |
| 7,499,275 B2 | * | 3/2009 | Lai et al. | 361/695 |
| 7,609,517 B2 | * | 10/2009 | Sun | 361/692 |
| 7,663,881 B2 | * | 2/2010 | Kuo | 361/692 |
| 2007/0245701 A1 | * | 10/2007 | Su | 55/490 |
| 2012/0188713 A1 | * | 7/2012 | Chen | 361/688 |

FOREIGN PATENT DOCUMENTS

JP        2007-173330        7/2007

OTHER PUBLICATIONS

English Language Abstract and Translation for JP 2007-173330 published Jul. 5, 2007.

* cited by examiner

*Primary Examiner* — James O Hansen
(74) *Attorney, Agent, or Firm* — DLA Piper LLP (US)

(57) ABSTRACT

A casing for electrical equipment has a drip-proof structure and includes a first plate and a second plate. The first plate has a plurality of first openings and a plurality of tongue-shaped louvers disposed in the respective first openings. Each louver has a lower end continuous to the first plate. The upper end side of each louver is folded to a back side of the first plate. The second plate is disposed on a front of the first plate. The second plate has a plurality of second openings each having a smaller area than each first opening. The first and second plates are overlapped with each other so that the first and second openings communicate with each other, forming a louver structure. The first and second plates are coated in the overlapped state with a result that a gap between them is filled with a paint.

4 Claims, 5 Drawing Sheets

US 9,295,173 B2

CASING FOR ELECTRICAL EQUIPMENT

CROSS-REFERENCE TO RELATED APPLICATIONS

This application is based upon and claims the benefit of priority from the prior Japanese Patent Application No. 2014-088224 filed on Apr. 22, 2014, the entire contents of which are incorporated herein by reference.

FIELD

Embodiments described herein relate to a casing for electrical equipment.

BACKGROUND

A casing for electrical equipment, for example, a casing for an inverter is formed of a metal plate such as an iron plate. A louver structure 1 as shown in FIGS. 4 and 5 is generally employed when a drip-proof construction is required for openings formed in a side of the casing for the purpose of cooling an atmosphere in an interior of the casing. The structure is referred to as "louver window," in which a metal plate 2 forming the casing is provided with outwardly protruding louvers 3 and openings 4 which are vertically arranged into a plurality of stages, respectively. Each one of the louvers 3 has an upper end and right and left ends all of which are continuous to the plate 2. Each louver 3 further has a lower end separated from the plate 2, so that an opening 4 is defined inside the lower end. The louver structure 1 thus constructed can ensure ventilation between an interior and an exterior of the casing through the openings 4 thereby to be capable of cooling an atmosphere in the interior of the casing. Further, the louvers 3 are constructed to prevent water drops from entering into the interior of the casing.

The louver structure 1 thus constructed has the following problems. The louvers 3 protrude outward from the side surface of the plate 2. This increases an overall size of product. Further, a forming die (a metal die) is required to obtain a shown shape of louver 3.

DETAILED DESCRIPTION

In general, according to one embodiment, a casing for electrical equipment, which has a drip-proof louver structure, includes a first plate made of a metal and a second plate made of a metal. The first plate has a plurality of first openings and a plurality of tongue-shaped louvers disposed in the respective first openings. Each one of the louvers has a lower end continuous to the first plate and right and left ends and an upper end all of which are separated from the first plate. The upper end side of each louver is folded to a back side of the first plate with the lower end serving as a fulcrum. The second plate is disposed on a front of the first plate and has a plurality of second openings each one of which has a smaller area than each first opening. The first and second plates are overlapped with each other so that the first and second openings communicate with each other, thereby forming a louver structure. The first and second plates are coated in the overlapped state with a result that a gap therebetween is filled with a paint.

Figure 1:
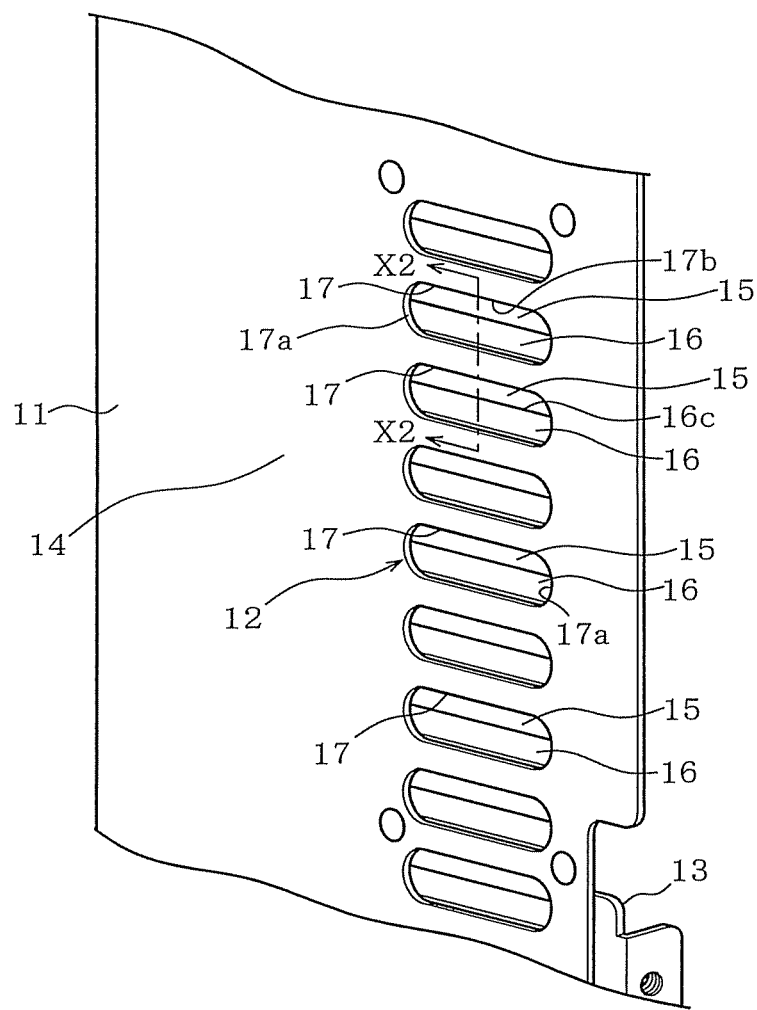
FIG. 1 is a perspective view of the louver structure employed in a casing according to one embodiment.
Figure 2:
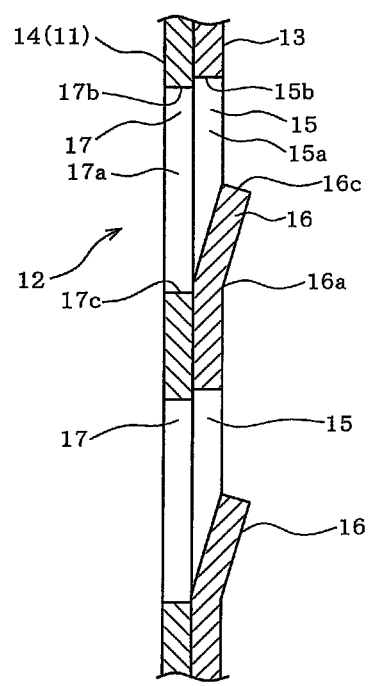
FIG. 2 is an enlarged longitudinal side section taken along line X2-X2 in FIG. 1.
Figure 3:
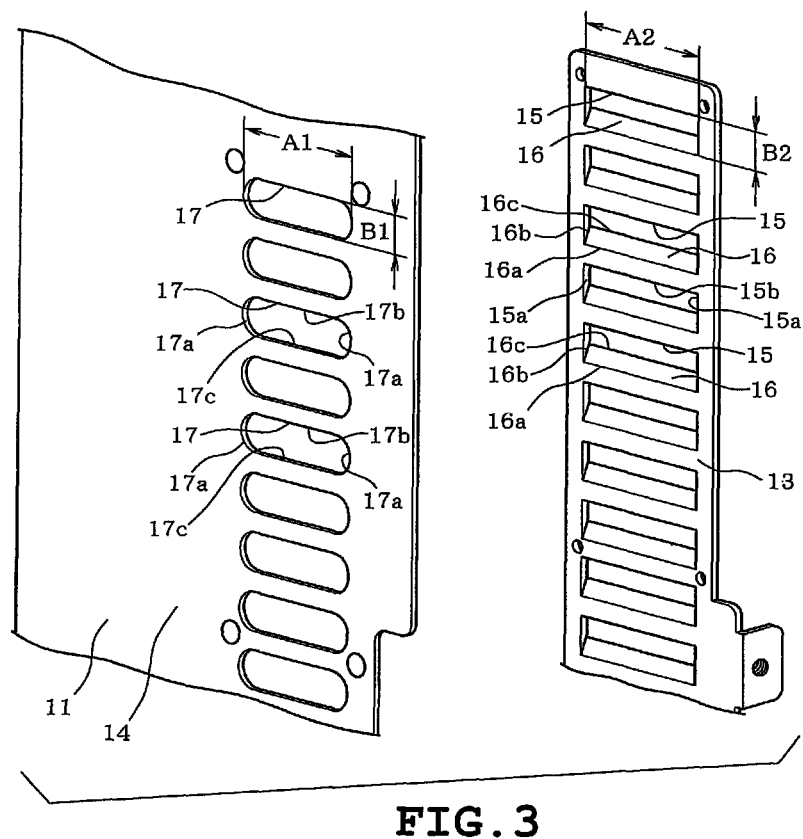
FIG. 3 is an exploded perspective view of a part of the louver structure.
Figure 4:
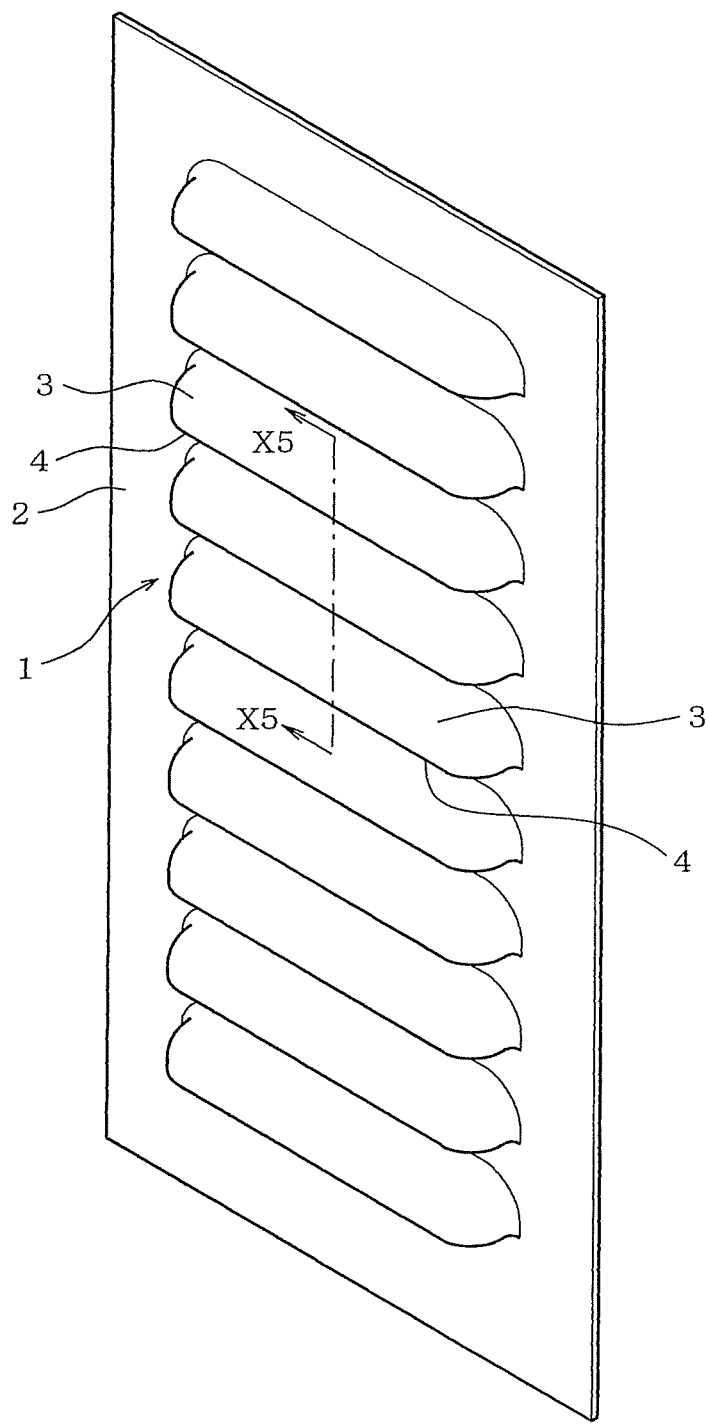
FIG. 4 is a perspective view of a conventional louver structure.
Figure 5:
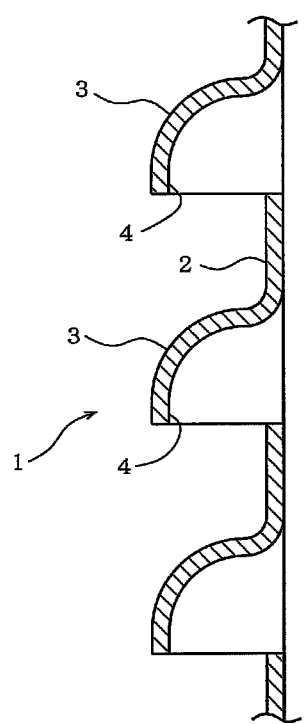
FIG. 5 is a longitudinal side section taken along line X5-X5 in FIG. 4.

An embodiment of the casing for electrical equipment will be described with reference to FIGS. 1 to 3. Referring to FIG. 1, reference numeral 11 designates a part of a casing 11 for electrical equipment such as an inverter. The casing 11 is provided with a drip-proof louver structure 12. The louver structure 12 is constructed of a first plate 13 and a second plate 14 both of which are overlapped with each other, as shown in FIGS. 2 and 3. Each one of the first and second plates 13 and 14 is made of a metal such as iron and has a thickness of 2 mm, for example. In this case, the second plate 14 is a part of the casing 11, and the first plate 13 is disposed on a rear surface of the second plate 14. In other words, the second plate 14 formed integrally with the casing 11 is disposed on a front surface of the first plate 13.

The first plate 13 is formed into a vertically long rectangular shape as viewed in FIG. 3 and has a plurality of first openings 15 and louvers 16 both of which are vertically arranged into a plurality of stages. Each one of the first openings 15 is formed into a horizontally long rectangular shape. The louvers 16 are located in the first openings 15 respectively. Each one of the louvers 16 is formed into the shape of a horizontally long rectangular tongue. Each louver 16 has a lower end 16a continuous to the first plate 13. Each louver 16 further has right and left ends 16b and an upper end 16c all of which are separated from the first plate 13. As a result, the upper end 16c side is folded with the lower end 16a serving as a fulcrum thereby to be inclined to the back surface side of the first plate 13. Each louver 16 is folded so that the upper end 16c is displaced substantially by a distance corresponding to the thickness of the first plate 13 to the back surface side of the first plate 13.

In this case, the first openings 15 and the louvers 16 can be formed by laser-processing the first plate 13 and thereafter by folding louvers 16 to the back surface side using a press brake.

The second plate 14 has second openings 17 which are vertically arranged into a plurality of stages so as to correspond to the first openings 15 and the louvers 16 respectively. Each one of the second openings 17 is formed to be horizontally long in shape as viewed in FIGS. 1 and 3 and has right and left arc-shaped edges 17a. Each second opening 17 is set to have a smaller area than an area of the corresponding first opening 15. More specifically, as shown in FIG. 3, each second opening 17 has a horizontal width A1 which is set to be smaller than a horizontal width A2 of the corresponding first opening 15 (A1<A2. Further, each second opening 17 has a vertical height B1 which is set to be substantially equal to or slightly smaller than a vertical height B2 of the corresponding first opening 15 (B1<B2).

The first plate 13 is disposed on the back side of the second plate 14 or the second plate 14 is disposed on the front side of the first plate 13, with the result that the first and second plates 13 and 14 are overlapped with each other so that the second openings 17 communicate with the corresponding first openings 15 respectively. The first and second plates 13 and 14 are then connected together by connecting means such as rivets.

In this case, the right and left side edges 17a of each second opening 17 are located inner than the right and left side edges 15a of the corresponding first opening 15. Further, as shown in FIG. 2, each second opening 17 has an upper edge 17b which is located lower than the an upper edge 15b of the corresponding first opening 15. The lower edge 17c of each second opening 17 is located slightly lower than the lower edge 16a of louver 16 serving as a lower edge of the corresponding first opening 15.

The drip-proof louver structure 12 is thus formed in the casing 11 by overlapping and connecting the first and second plates 13 and 14 in the manner as described above. The first and second plates 13 and 14 are coated in the overlapped state. The coating treatment fills gaps formed between the right and left sides 16b of the louvers 16 and the right and left side edges 15a of the first openings 15 with paint (not shown). Furthermore, the coating treatment also fills gaps formed between the first and second plates 13 and 14 with the paint (not shown).

In the above-described construction, the louver structure 12 of the casing 11 has a double layered structure including the first and second plates 13 and 14. The first and second plates 13 and 14 are formed with the first and second openings 15 and 17 communicating with each other, respectively. Accordingly, the first and second openings 15 and 17 realize the cooling of interior atmosphere of the casing 11. Further, the inner first plates 13 are formed with the respective tongue-shaped louvers 16 in the louver structure 12. Moreover, each second opening 17 of the outer second plate 14 has a smaller area than the corresponding first opening 15 of the inner first plate 13. As a result, the louver structure 12 can provide a drip-proof structure that can prevent water drops from entering into the interior of the casing 11.

In this case, the louvers 16 do not protrude out of the casing 11 although protruding inside the casing 11 (to the back side of the first plate 13). Accordingly, no parts protruding out of the casing 11 are provided. Further, since the louvers 16 are formed by the laser treatment and the folding by the use of the press brake, the louver structure 12 does not require the making of forming die differing from the conventional louver window in which the louvers 3 are formed using the a forming die. Further, the second openings 17 of the second plate 14 located outside can increase the freedom in the design thereof, for example, the right and left side edges 17a of each second opening 17 are formed into the arc shape.

Since the first and second plates 13 and 14 are coated in the overlapped state, the gaps formed between the right and left sides 16b of the louvers 16 and the right and left side edges 15a of the first openings 15 are filled with the paint (not shown). Furthermore, the gaps formed between the first and second plates 13 and 14 are also filled with the paint (not shown). This can further improve the drip-proof performance of the louver structure 12.

Each louver 16 is folded so that the upper end 16c is displaced substantially by the distance corresponding to the thickness of the first plate 13 to the rear surface side. According to this construction, gaps defined between the right and left sides of the louvers 16 and the side edges 15a of the first openings 15 can be rendered as small as possible, with the result that the drip-proof performance of the louver structure 12 can further be improved.

The second plate 14 is formed integrally with the casing 11. As a result, the louver structure 12 can be constructed by addition of the first plate 13. This can simplify the construction of the louver structure 12.

Although the second plate 14 is constituted by a part of the casing 11 in the foregoing embodiment, the first and second plates 13 and 14 forming the louver structure 12 may be separate components from the casing 11.

The first and second plates 13 and 14 maybe welded together, instead of being riveted.

The electrical equipment to which the casing 1 is applied should not be limited to the inverter. The casing 1 may be applied to any electrical equipment requiring the cooling of interior atmosphere thereof.

According to the foregoing embodiment, the casing for the electrical equipment includes the first plate having the first openings and the louvers folded to the back side and the second plate having the second openings communicating with the first openings. The first and second plates are overlapped with each other into the louver structure. As a result, although the casing has the drip-proof louver structure, protrusions out of the casing can be eliminated. Moreover, no forming die for forming the louver structure is required.

While certain embodiments have been described, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. A casing for electrical equipment, which has a drip-proof louver structure, the casing comprising:
   a first plate made of a metal and having a plurality of first openings and a plurality of tongue-shaped louvers disposed in the respective first openings, each one of the louvers having a lower end continuous to the first plate and right and left ends and an upper end all of which are separated from the first plate, the upper end side of each louver being folded to a back side of the first plate with the lower end serving as a fulcrum; and
   a second plate made of a metal and disposed on a front of the first plate, the second plate having a plurality of second openings each one of which has a smaller area than each first opening,
   wherein the first and second plates are overlapped with each other so that the first and second openings communicate with each other, thereby forming a louver structure; and
   the first and second plates are coated in the overlapped state with a result that a gap therebetween is filled with a paint.

2. The casing according to claim 1, wherein the gap includes first gaps defined between right and left side edges of the first openings of the first plate and right and left sides of the louvers respectively, and the first gaps are filled with the paint.

3. The casing according to claim 2, wherein each louver is folded so that an upper end thereof is displaced to the back side thereof and formed so that a distance from each first opening to an outer edge of the upper end of each louver substantially equals a thickness of the first plate.

4. The casing according to claim 1, wherein each louver is folded so that an upper end thereof is displaced to the back side thereof and formed so that a distance from each first opening to an outer edge of the upper end of each louver substantially equals a thickness of the first plate.

* * * * *